(12) United States Patent
Kato et al.

(10) Patent No.: US 8,017,505 B2
(45) Date of Patent: Sep. 13, 2011

(54) METHOD FOR MANUFACTURING A SEMICONDUCTOR DEVICE

(75) Inventors: Juri Kato, Chino (JP); Shunichiro Ohmi, Yokohama (JP)

(73) Assignees: Seiko Epson Corporation, Tokyo (JP); Tokyo Institute of Technology, Tokyo (JP)

( * ) Notice: Subject to any disclaimer, the term of this patent is extended or adjusted under 35 U.S.C. 154(b) by 326 days.

(21) Appl. No.: 11/947,365

(22) Filed: Nov. 29, 2007

(65) Prior Publication Data

US 2008/0176385 A1     Jul. 24, 2008

(30) Foreign Application Priority Data

Nov. 30, 2006  (JP) .................................. 2006-324334
Nov. 8, 2007   (JP) .................................. 2007-290698

(51) Int. Cl.
*H01L 21/20* (2006.01)
(52) U.S. Cl. ....................................................... 438/479
(58) Field of Classification Search .................. 438/479
See application file for complete search history.

(56) References Cited

U.S. PATENT DOCUMENTS

| 7,465,641 | B2 * | 12/2008 | Hara et al. | 438/401 |
| 7,524,705 | B2 * | 4/2009 | Kanemoto | 438/149 |
| 7,553,713 | B2 * | 6/2009 | Hara | 438/164 |
| 7,666,795 | B2 * | 2/2010 | Kato et al. | 438/718 |
| 2004/0259328 | A1 * | 12/2004 | Ito et al. | 438/459 |
| 2006/0091426 | A1 * | 5/2006 | Hara | 257/211 |
| 2006/0118759 | A1 * | 6/2006 | Klein et al. | 252/79.1 |
| 2006/0202276 | A1 * | 9/2006 | Kato | 257/368 |
| 2006/0223270 | A1 * | 10/2006 | Hara | 438/294 |
| 2006/0223271 | A1 * | 10/2006 | Hara et al. | 438/294 |
| 2007/0004212 | A1 * | 1/2007 | Takizawa et al. | 438/694 |
| 2007/0026582 | A1 * | 2/2007 | Kanemoto | 438/149 |
| 2008/0090348 | A1 * | 4/2008 | Chang et al. | 438/199 |

OTHER PUBLICATIONS

Sakai T. et al., "Separation by Bonding Si Islands (SBSI) for LSI Applications," May 2004, Second International SiGe Technology and Device Meeting, Meeting Abstract, pp. 230-231.
Sakai T. et al., "Separation by Bonding Si Islands (SBSI) for LSI Applications," Second International SiGe Technology and Device Meeting, Meeting Abstract, pp. 230-231, May 2004.

* cited by examiner

*Primary Examiner* — Matthew Smith
*Assistant Examiner* — Grant Withers
(74) *Attorney, Agent, or Firm* — Oliff & Berridge PLC

(57) ABSTRACT

A method of manufacturing a semiconductor device, comprises; a) forming a SiGe layer on a substrate; b) forming a Si layer on the SiGe layer; c) forming a groove that exposes the side surface of the SiGe layer by partly etching the Si layer and the SiGe layer; and d) forming a hollow portion between the substrate and, the Si layer by etching the SiGe layer via the groove. Step d) further comprises: forming a part of the hollow portion by supplying a new liquid including a fluorinated nitric acid solution to the substrate and etching the SiGe layer, removing the fluorinated nitric acid solution once from the hollow portion that is under formation; and etching the SiGe layer by refilling a new liquid including a fluorinated nitric acid solution to the hollow portion.

9 Claims, 9 Drawing Sheets

METHOD FOR MANUFACTURING A SEMICONDUCTOR DEVICE

BACKGROUND OF THE INVENTION

1. Technical Field

The present invention relates to a method of manufacturing a semiconductor device, in particular, a method of improving selection ratio of materials such as Si and Ge at the time of etching.

2. Related Art

The utility of a field effect transistor formed on a SOI substrate is brought to an attention because of easiness for isolating elements, latch up free and small source and drain contact capacitance. In particular, a perfect depletion SOI transistor has the capability of fast driven operation with low power consumption and is easily driven by low voltage, enhancing active research for driving SOI transistors with the prefect depletion mode. "Separation Bonding SI Islands (SBSI) for LSI application," Second International SiGe Technology and Device meeting, Meeting Abstract, pp. 230 to 231, May 2004 written by T. Sakai et al. discloses a method (SBSI method) in which a SOL layer is formed on a bulk substrate to reduce a cost of manufacturing SOI transistors. In the SBSI method disclosed in this document, a hollow portion is formed between a Si layer and a Si substrate by forming Si and SiGe layers on a silicon substrate and selectively removing only the SiGe layer with utilizing different etching rate between Si and SiGe. Then silicon exposed in the hollow portion is thermally oxidized. The oxidized silicon layer is embedded to a space between the Si substrate and the Si layer, forming a BOX layer between the Si substrate and the Si layer. In this conventional SBSI method, however, the etching ratio of the SiGe layer to the Si layer was deteriorated if it takes long time to selectively etch only the SiGe layer among multiple layers such as Si, SiGe and Si layers. Such deterioration unintentionally accelerates etching of the Si layer at the time of removing the SiGe layer, facing difficulty in forming stable configuration and uniform thickness of large area's SOI layers or if it has various configurations, lowering the yield.

SUMMARY

An advantage of the present invention overcomes the above issues and is to provide a method of manufacturing a semiconductor device in which acceleration of etching a Si layer is avoided at the time of etching a SiGe layer.

The inventor made various experiments regarding selective etching of SiGe with using fluorinated nitric acid. As a result, he/she found a mechanism of selective etching in which SiGe works as an anode, Si works as a cathode and SiGe is removed by the electrochemical reaction shown as the following formula (1),

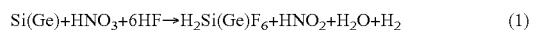

$$Si(Ge)+HNO_3+6HF \rightarrow H_2Si(Ge)F_6+HNO_2+H_2O+H_2 \quad (1)$$

Viewing the formula (1), the inventor considers that etching Si is accelerated (selective ratio of etching is deteriorated) due to a Si region working as not only a cathode but an anode because of increasing the concentration of nitrous acid when nitrous acid is generated after long time etching of SiGe with fluorinated nitric acid liquid. Further, the inventor considers that, in the hollow portion formed by the SBSI method, the height from the bottom to the top is small and its depth is deep, making nitrous acid and etched products such as Si(Ge) fluorinated products diffuse slowly. This slow diffusion lowers HF concentration in the hollow portion and easily increases concentration of nitrous acid and etched products. In the experiment done by the inventor, selective etching ratio of Si to SiGe was sharply deteriorated two or three minutes later after starting the etching if the SiGe layer is etched in the fluorinated nitric acid for long time. The present invention can be attained based on the above experiment.

According to a first aspect of the invention, a method of manufacturing a semiconductor device comprises; a) forming an SiGe layer on a substrate; b) forming an Si layer on the SiGe layer; c) forming a groove that exposes the side surface of the SiGe layer by partly etching the Si layer and the SiGe layer, and d) forming a hollow portion between the substrate and the Si layer by etching the SiGe layer via the groove. Step d) further comprises: forming a part of the hollow portion by supplying a new liquid including a fluorinated nitric acid solution to the substrate and etching the SiGe layer; removing the fluorinated nitric acid solution once from the hollow portion that is under formation; and etching the SiGe layer by refilling a new liquid including a fluorinated nitric acid solution to the hollow portion.

Here, "the new liquid including a fluorinated nitric acid solution" means a fluorinated nitric acid solution before generating nitrous acid (or extremely low concentration of nitrous acid), an unused solution which is never used for etching the SiGe layer, for example. Otherwise, "the new liquid including a fluorinated nitric acid solution" means a solution, even when the solution has been used for etching the SiGe layer several times, of which etching rate to the Si layer is as low as that of the above unused solution (namely no deterioration is advanced.) According to the first aspect of the invention, the new liquid including a fluorinated nitric acid solution is supplied into the hollow portion that is under formation before increasing the concentration of the nitrous acid, always constraining a predetermined concentration of the nitrous acid and etched products within the hollow portion. Accordingly, the acceleration of etching the Si layer facing the hollow portion can be avoided.

According a second aspect of the invention, a method of manufacturing a semiconductor device comprises: a) forming an SiGe layer on a substrate; b) forming an Si layer on the SiGe layer; c) forming a groove that exposes the side surface of the SiGe layer by partly etching the Si layer and the SiGe layer; and d) forming a hollow portion between the substrate and the Si layer by etching the SiGe layer via the groove. Step d) further comprises e) etching the SiGe layer by intermittently supplying a new liquid including a fluorinated nitric acid solution from a nozzle to the substrate while rotating the substrate.

According to the second aspect of the invention, the fluorinated nitric acid solution is removed once from the hollow portion that is under formation. Then, the new liquid including a fluorinated nitric acid solution is refilled into the hollow portion to etch the SiGe layer. Accordingly, a predetermined concentration of the nitrous acid and etched products within the hollow portion is always constrained, avoiding the acceleration of etching the Si layer facing the hollow portion.

According the second aspect of the invention, step e) may include alternately supplying the new liquid including the fluorinated nitric acid solution and pure water from the nozzle to the substrate. This alternately supplying pulls the fluorinated nitric acid stayed in the hollow portion toward the outside of the hollow portion due too the surface tension of pure water, easily removing the fluorinated nitric acid from the hollow portion.

According to a third aspect of the invention, a method of manufacturing a semiconductor device comprises: a) forming a SiGe layer on a substrate; b) forming an Si layer on the SiGe layer; c) forming a groove that exposes the side surface of the SiGe layer by partly etching the Si layer and the SiGe layer, and d) forming a hollow portion between the substrate and the Si layer by etching the SiGe layer via the groove. Step d) further comprises etching the SDiGe layer by repeating dipping the substrate into a new liquid including a fluorinated nitric acid solution stored in an etching process chamber.

According the third aspect of the invention, dipping the substrate into the etching process chamber supplies the new liquid including a fluorinated nitric acid solution to the inside of the hollow portion and taking the substrate out of the etching process chamber removes the fluorinated nitric acids solution stayed in the hollow portion. Accordingly, the new liquid including a fluorinated nitric acid solution is supplied into the hollow portion that is under formation before increasing the concentration of the nitrous acid, always constraining a predetermined concentration of the nitrous acid and etched products within the hollow portion. Hence, the acceleration of etching the Si layer facing the hollow portion can be avoided.

According the third aspect of the invention, step d) may further comprise; alternately repeating dipping the substrate into a new liquid including a fluorinated nitric acid solution stored in an etching process chamber for etching and dipping the substrate into pure water stored in an rinsing process chamber for rinsing. This alternately dipping pulls the fluorinated nitric acid stayed in the hollow portion toward the outside of the hollow portion due to the surface tension of pure water, easily removing the fluorinated nitric acid from the hollow portion.

According to the third aspect of the invention, step d) may further comprise dipping the substrate into a new liquid including a fluorinated nitric acid solution stored in each of plurality of etching process chambers in series.

According to the above process, step d) may further comprise dipping the substrate into pure water stored in each of plurality of rinsing process chambers in series.

Further, according to the first aspect of the invention, the new liquid including the fluorinated nitric acid solution may include $HNO_3$ and $H_2O$ of which volume ratio to HF is more than or equal to fifty times.

According to the first aspect of the invention, the new liquid including the fluorinated nitric acid solution may include acetic acid. This inclusion of acetic acid constrains generating the nitrous acid, at the time etching the SiGe layer with the new liquid including the fluorinated nitric acid solution, attaining favorite etching ratio to Si, Further, the inventor's experiment confirmed that the method of the invention does not deteriorate the etching selective ratio of the SiGe layer to the Si layer even when the SiGe layer is etched for long time.

According to the first aspect of the invention, the method further comprises: forming a oxide layer in the hollow portion, and forming an insulating layer on the substrate of which height is the same of upper surface of the Si layer so as to form a SOI structure.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings.

First Embodiment

FIGS. 1 to 7 are views showing a method for manufacturing a semiconductor device according to an embodiment of the invention. FIG. 1A to FIG. 7A are plain views and FIG. 1B to FIG. 7B are cross sections crossing each of line A-A' to line A7-A' 7 in FIG. 1A to FIG. 7A. FIG. 4C to FIG. 6C are cross sections crossing each of line B4-B' 4 to line B6-B6' in FIG. 4A to FIG. 6A.

In the embodiment, the SBSI method is applied to the present invention. When the SOI structure is formed by the SBSI method, Si and SiGe layers are formed on a Si substrate 1 and a hollow portion is formed between the Si substrate 1 and the Si layer by selectively removing only the SiGe layer using different etching rate between Si and SiGe. Then, Si exposed in the hollow portion is thermally oxidized, embedding a $SiO_2$ layer between the Si substrate 1 and the Si layer and forming a BOX layer between the Si substrate 1 and the Si layer. Such SBSSI method will be explained.

Figure 1A:
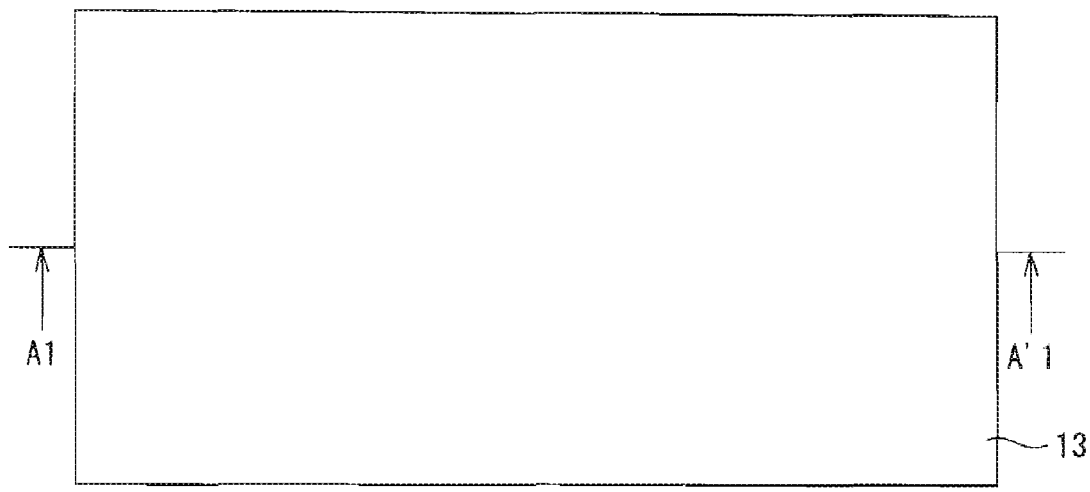
FIG. 1 shows a method of manufacturing a semiconductor device of a embodiment (first).
Figure 1B:
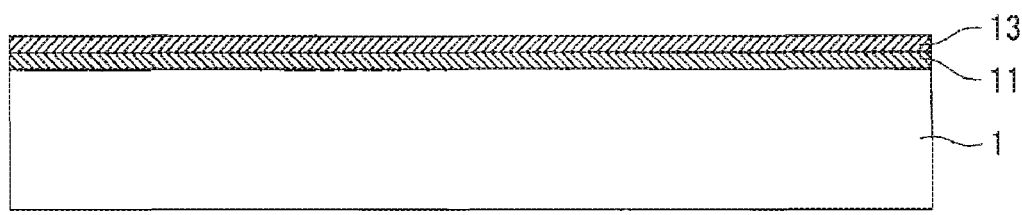

Namely, in FIG. 1A and FIG. 1B, an element separation layer not shown in the figure is formed in the bulk silicon substrate 1 by using the LOCOS method. Next, a silicon buffer layer not shown in the figure is formed on the Si substrate 1, then, the silicon germanium (SiGe) layer 11 is formed on it, further, the silicon (Si) layer 13 is formed on it. These Si buffer layer, SiGe layer 11 and Si layer 13 are continuously grown by an epitaxial growing method, for example, to be a single crystalline semiconductor layer. The thickness of the SiGe layer is 5 to 100 nm.

Figure 2A:
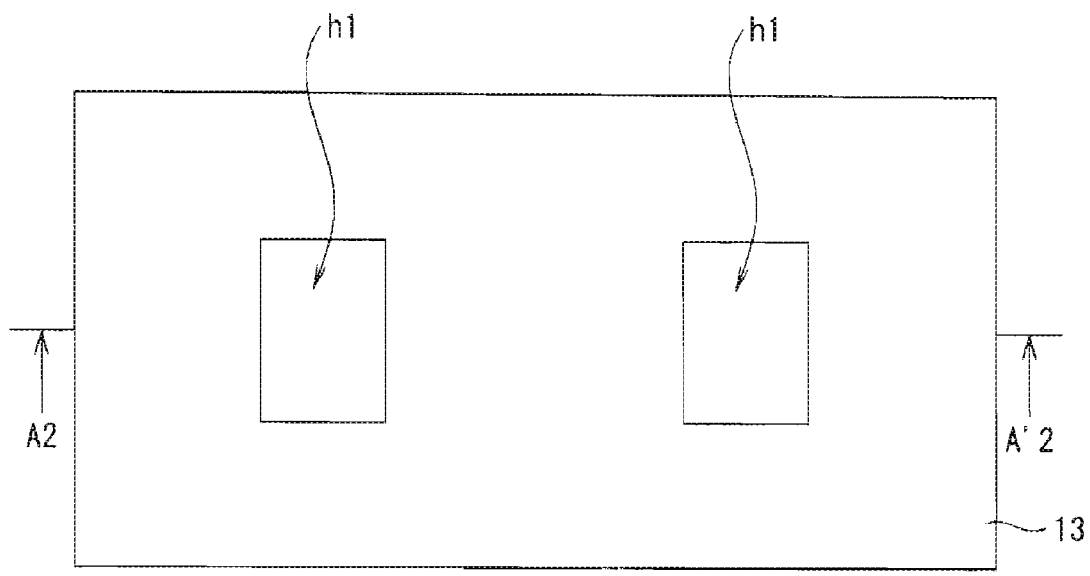
FIG. 2 shows a method of manufacturing a semiconductor device of the embodiment (second.)
Figure 2B:
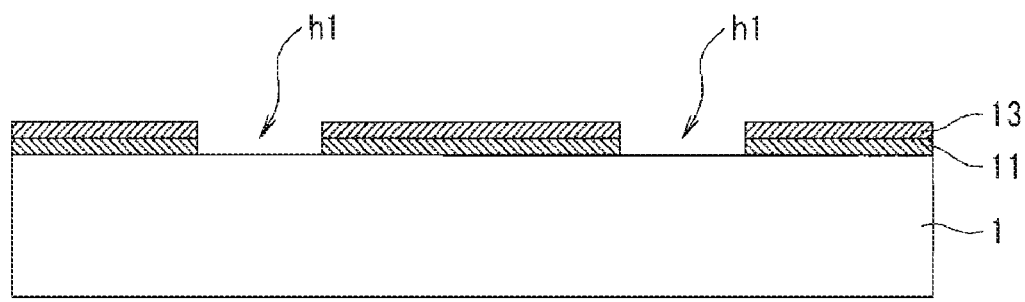

Next, as shown in FIGS. 2A and 2B, these Si buffer layer (not shown), Si Ge layer 11 and Si layer 13 are partly etched by photolithography and etching technologies. The etching forms a supporting hole h1 penetrating through these Si buffer layer, Si Ge layer 11 and Si layer 13 to reach the Si substrate 1 in a region in which these layers are overlapped with an element separation region (a region in which the SOI structure is not formed.) In the etching process for forming the supporting hole h1, etching may be stopped at the surface of the Si substrate 1 or the Si substrate 1 may be over etched, forming a recess.

Figure 3A:
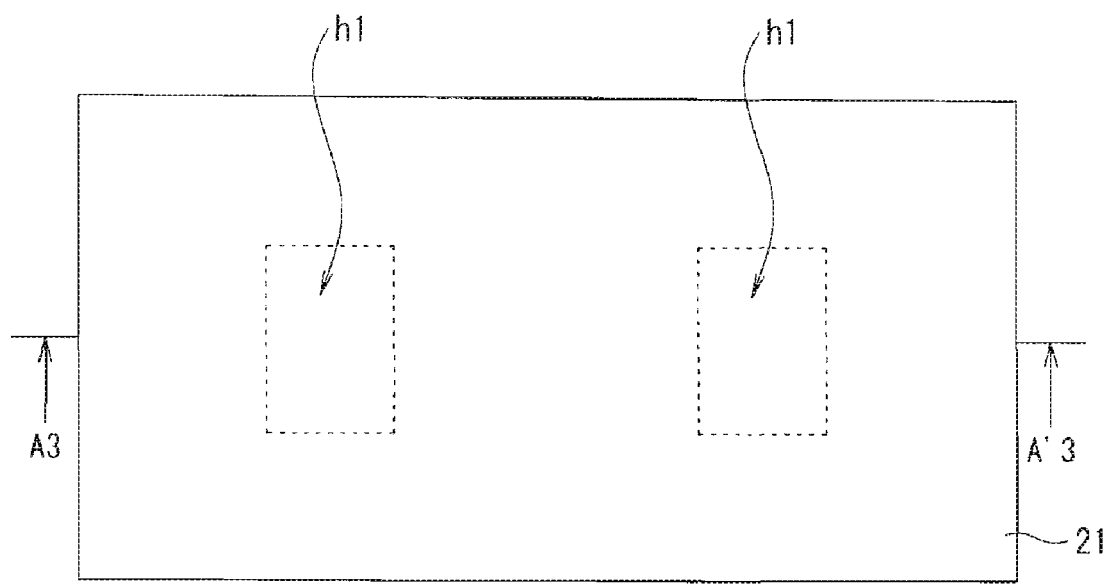
FIG. 3 shows a method of manufacturing a semiconductor device of the embodiment (third.)
Figure 3B:
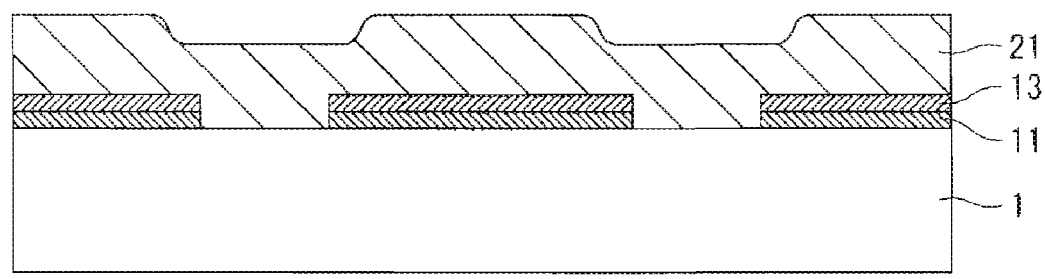
Figure 4A:
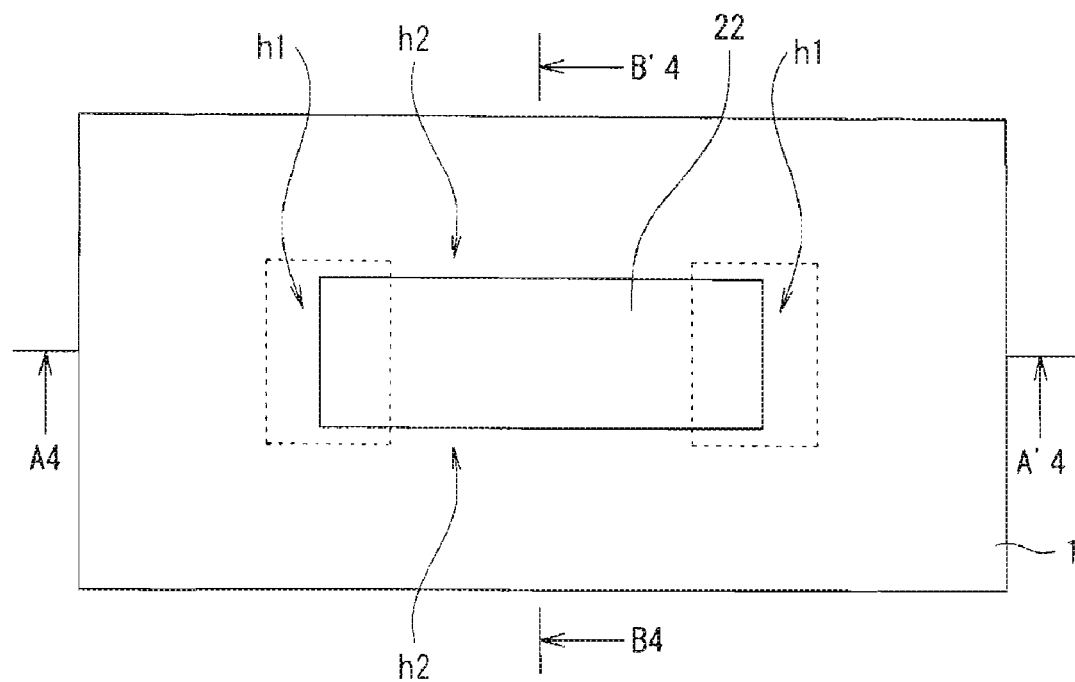
FIG. 4 shows a method of manufacturing a semiconductor device of the embodiment (fourth.)
Figure 4B:
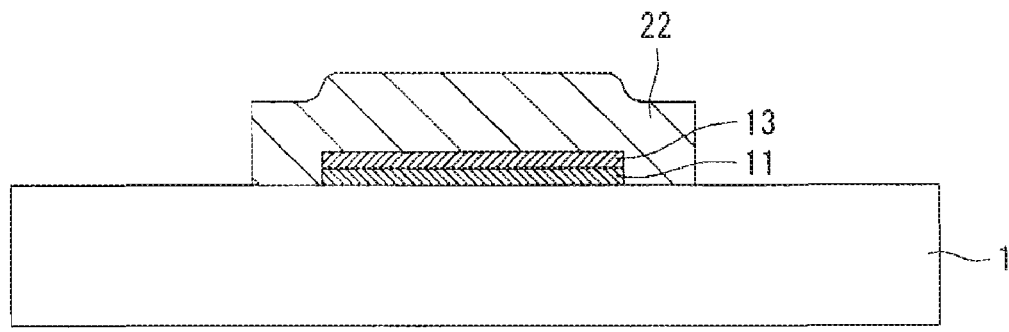
Figure 4C:
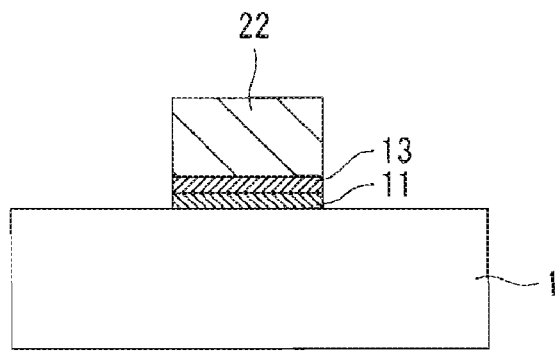

Next, as shown in FIGS. 3A and 3B, a supporting film 21 is formed on an entire surface of the Si substrate 1 while embedding a material of the film into the supporting hole h1. The material of the supporting film 21 is oxide silicon ($SiO_2$), for example, formed by CVD. Next, as shown in FIGS. 4A to 4C, these supporting film 21, Si buffer layer (not shown), Si Ge layer 11 and Si layer 13 are partly and sequentially etched by photolithography and etching technologies, forming a supporting member 22 from the supporting film 21. A groove h2 exposing the surface of the Si substrate 1 is simultaneously formed with the above process. In the etching process for forming the groove h2, etching may be stopped at the surface of the Si substrate 1, or the Si substrate 1 may be over etched, forming a recess.

Figure 5A:
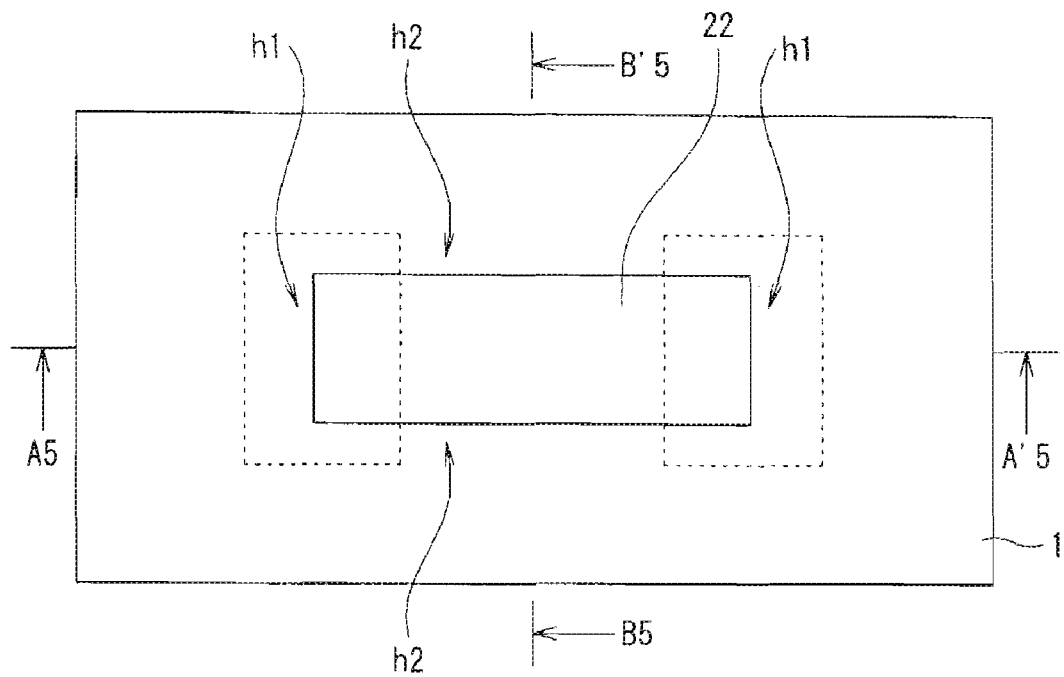
FIG. 5 shows a method of manufacturing a semiconductor device of the embodiment (fifth.)
Figure 5B:
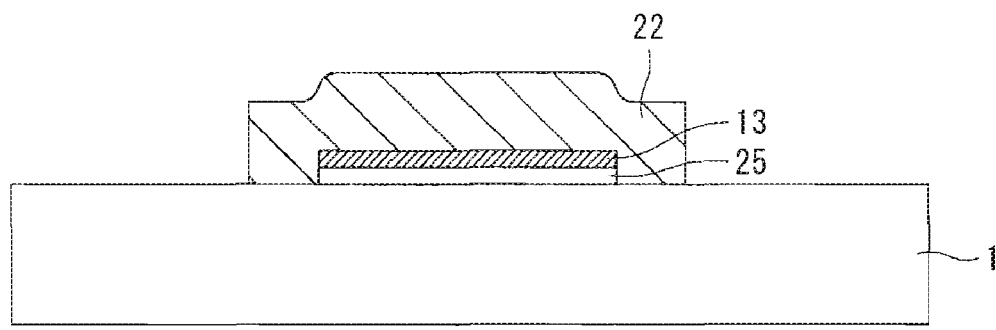
Figure 5C:
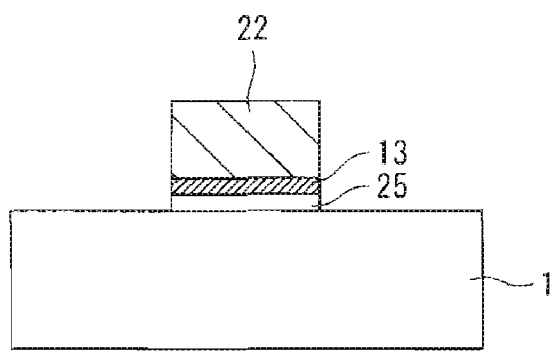

Next, as shown in FIGS. 4A to 4C, the fluorinated nitric acid solution is applied to and contacted with the side surfaces of SiGe layer 11 and Si layer 13, selectively etching and removing the SiGe layer 11. As shown in FIGS. 5A to 5C, this etching forms the hollow portion 25 between the Si layer 13 and the Si substrate 1. Here, etching rate of SiGe is larger than that of Si (namely selective ratio of etching SiGe to Si is about 400 to 1000), making it possible to etch and remove only the SiGe layer while leaving the Si layer 13 in this wet etching using a fluorinated nitric acid solution. After forming the hollow portion 25, the upper surface and side surface of the Si layer 13 are supported by the supporting member 22.

Figure 6A:
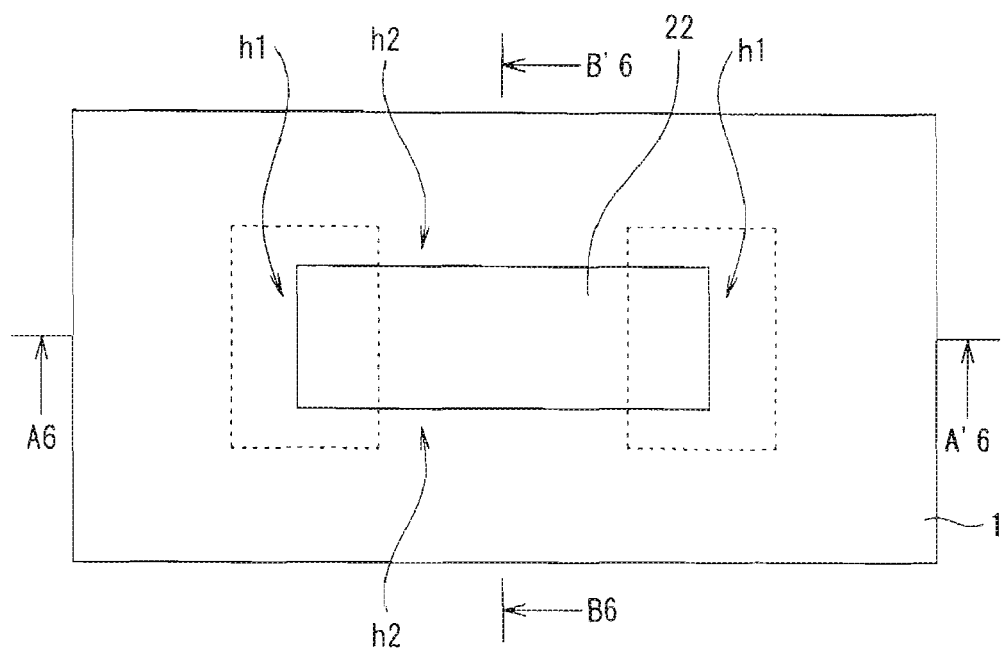
FIG. 6 shows a method of manufacturing a semiconductor device of the embodiment (sixth.)
Figure 6B:
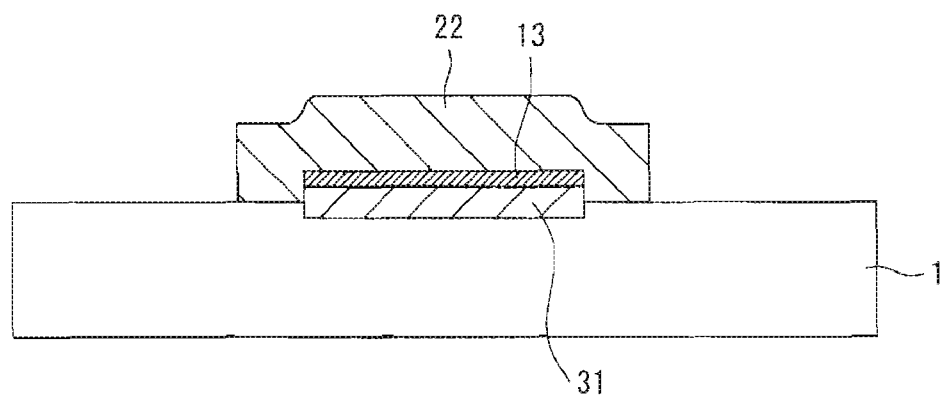
Figure 6C:
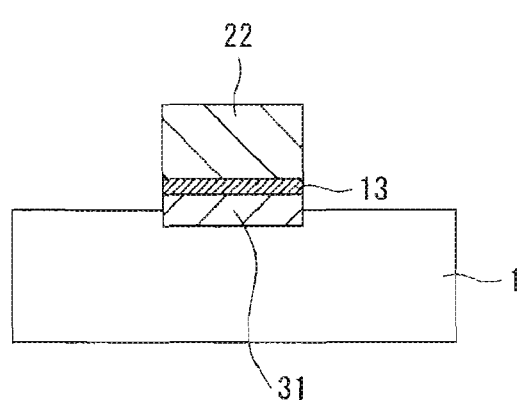
Figure 7A:
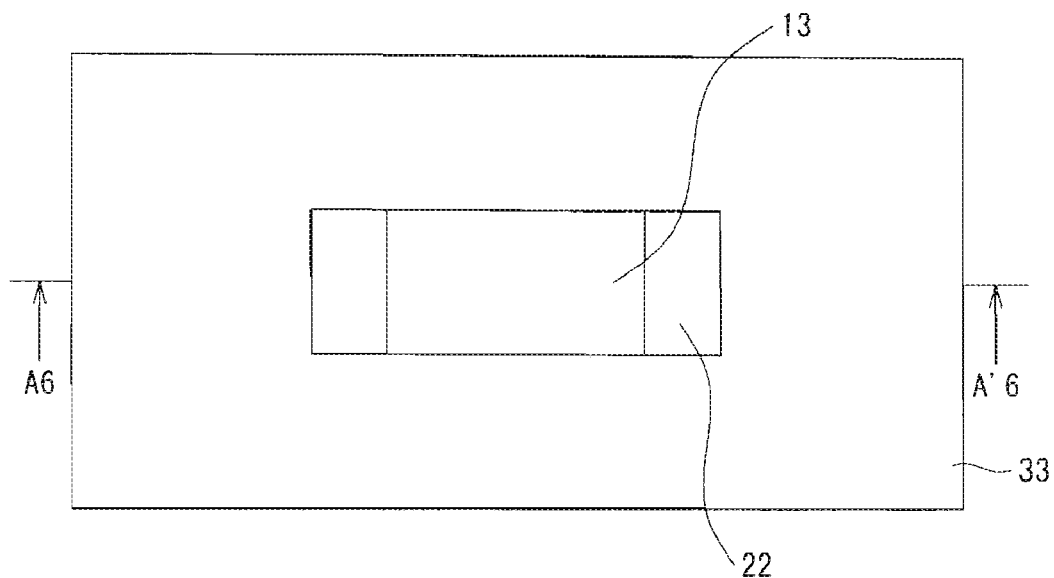
FIG. 7 shows a method of manufacturing a semiconductor device of the embodiment (seventh.)
Figure 7B:
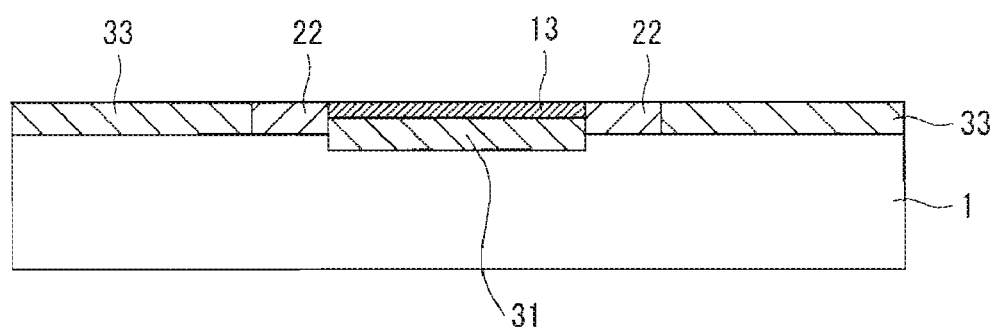

Then, as shown in FIGS. 6A to 6C, the Si substrate 1 is thermally oxidized, forming a $SiO_2$ film 31 within the hollow portion. After forming the $SiO_2$ film 31, an insulating film is formed on an entire surface of the Si substrate 1 by CVD and the like while embedding a material of the film into the supporting hole h1 and the groove h2 for introducing fluorinated nitric acid. The material of the insulating film is oxide silicon ($SiO_2$), or nitride silicon ($Si_3N_4$). Here, if the hollow portion is not completely embedded with the $SiO_2$ layer 31, this insulating film compensates embedding the hollow portion. Next, the insulation film covering over the entire surface of the Si substrate is planarized by CMP, further wet-etched if it is necessary. As shown in FIGS. 7A to 7B, this planarizing and etching forms the SOI structure by perfectly removing the insulating film 33 on the Si layer 13.

The above-mentioned processes are based on the SBSI method. Further, according to the embodiment, etching of the SiGe layer 11 to form the hollow portion 95 was devised to constrain the increase of nitrous acid within the hollow portion 25, avoiding accelerate etching of the Si layer 13. Here, wet etching using chemical is classified into two methods, such as a method (a spinning method) of discharging chemical to the surface of a rotating substrate and a method (a dipping method) of dipping a substrate into chemical stored in a chamber. In the embodiment, the concrete orders of processing are different between these two methods. Therefore, wet etching via a spinning method will be explained in the first embedment and wet etching via a dipping method will be explained in the second embodiment.

Figure 8A:
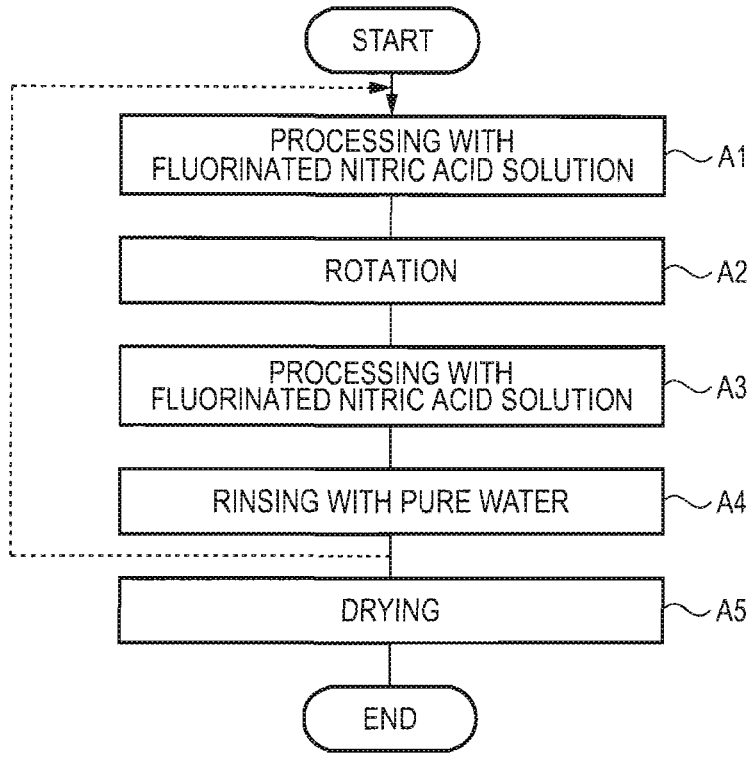
FIG. 8 shows orders of selective etching a SiGe layer 11 (an spinning method.)
Figure 8B:
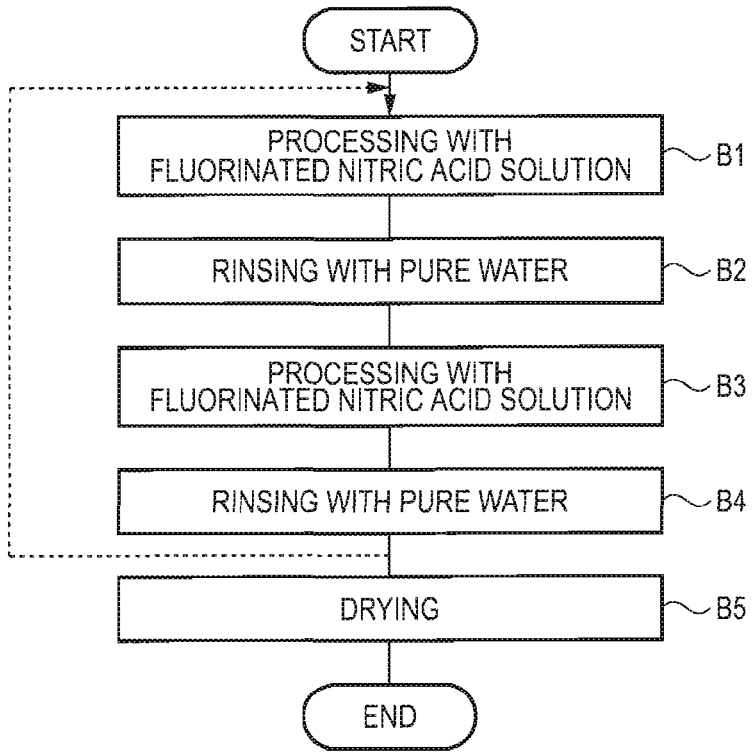

FIGS. 8A and 8B show procedures of selective etching (spinning type) of the SiGe layer 11. Wet etching with spinning is a method shown in FIG. 8A, or a method shown in FIG. 8B. Namely, in FIG. 8A, the Si substrate 1 is placed within the chamber for wet etching by spinning according to step a1. Then, the new liquid including a fluorinated nitric acid solution is discharged to the Si substrate 1 from a nozzle of the wet etching device while rotating the Si substrate 1. Here, rotating the Si substrate applies a centrifugal force to the fluorinated nitric acid solution discharged on the Si substrate 1, distributing the solution into an entire surface of the substrate. Then, the SiGe layer 11 facing the groove h2 is etched, forming a part of the hollow portion 25. It takes several tens of seconds to complete step a1.

Next, as step a2, discharging the fluorinated nitric acid solution to the Si substrate from the nozzle is stopped once while the Si substrate is rotated. This stopping generates a centrifugal force toward the outside direction of the hollow portion 25. This force is applied to the fluorinated nitric acid solution intruded in the hollow portion 25, removing the solution from the hollow portion 25. Next, as step a3, the fluorinated nitric acid solution to the Si substrate 1 from the nozzle is discharged again awhile the Si substrate is rotated. Similarly to step a1, the fluorinated nitric acid solution discharged to the Si substrate 1 is distributed to the surface of the substrate due to a centrifugal force, intruding into the inside of the hollow portion 25 and etching the SiGe layer 11. It takes several tens of seconds to complete step a3. Next, as step a4, pure water is discharged to the Si substrate 1 from the nozzle, rinsing the front and back surfaces of the Si substrate 1, removing residual of the fluorinated nitric acid solution. Then, as step a5, the Si substrate 1 is rotated with high speed within the chamber of the wet etching device, removing water from the Si substrate 1 and drying it.

The above-mentioned method removes the fluorinated nitric acid solution once from the inside of the hollow portion 25, which is under formation before increasing the concentration of nitrous acid in the hollow portion 25. Then, this method refills a new liquid including the fluorinated nitric acid solution into the hollow portion 25 to etch the SiGe layer 11. Hence, a composition of the fluorinated nitric acid solution in the hollow portion 25 can be maintained within the predetermined range, constraining a predetermined concentration of nitrous acid and etched products within the hollow portion 25. Accordingly, this method avoids accelerated etching of the Si layer 13 facing the hollow portion 25. As shown in FIG. 8A and indicated as the dotted arrow line, the method may be returned from step a4 to step a1 and step a1 to a4 may be repeated with arbitrary times. This repetition constrains accelerated etching of the Si layer 13 and extends etching time for the SiGe layer 11, forming the SOI layer having a large area with a high yield.

A method shown in FIG. 8B will now be described. In step b1 of FIG. 8B, first, the Si substrate 1 is placed in the chamber of the spinning type wet etching device. Then, the new liquid including the fluorinated nitric acid solution is discharged to the Si substrate 1 from a nozzle of the wet etching device while rotating the Si substrate 1. The fluorinated nitric acid solution discharged to the Si substrate 1 is distributed to the surface of the substrate due to a centrifugal force, intruding into the inside of the hollow portion 25 and etching the SiGe layer 11. It preferably takes several tens of seconds to complete step b1.

Next, in step b2, discharging the fluorinated nitric acid solution to the Si substrate 1 form a nozzle is stopped once. Then, pure water is discharged to the Si substrate 1 from a nozzle while rotating the Si substrate 1. This discharging generates a centrifugal force toward the direction directed to the outside of the hollow portion 25. This force is applied to the fluorinated nitric acid solution intruded in the hollow portion 25. Further, the centrifugal force is also applied to pure water discharged to the Si substrate 1 and makes water distributed to the surface of the substrate and reach the entrance of the hollow portion 25. As a result, the fluorinated nitric acid solution within the hollow portion 25 is pulled out and removed by the centrifugal force applied to the solution and the surface tension of pure water.

Next, as step b3, the fluorinated nitric acid solution to the Si substrate 1 from the nozzle is discharged again while the Si substrate 1 is rotated. Similarly to step b1, the fluorinated nitric acid solution discharged to the Si substrate 1 is distributed to the surface of the substrate due to a centrifugal force, intruding into the inside of the hollow portion 25 and etching the SiGe layer 11. It takes several tens of seconds to complete step b3. Next, the substrate is rinsed similarly to step b2, removing the fluorinated nitric acid solution from the front and back surface of the Si substrate 1 and the inside of the hollow portion 25. Then, as step b5, the Si substrate 1 is rotated with a high speed within the chamber of the wet etching device, removing water from the Si substrate 1 and drying it.

Similarly to FIG. 8A, the above mentioned method also removes the fluorinated nitric acid solution once from the inside of the hollow portion 25 A which is under formation before increasing the concentration of nitrous acid in the hollow portion 25. Then, this method refills a new liquid including fluorinated nitric into the hollow portion 25 to etch the SiGe layer 11. This method constrains a predetermined concentration of nitrous acid and etched products within the hollow portion 25. Accordingly, this method avoids accelerated etching of the Si layer 13 facing the hollow portion 25. Further, differing from FIG. 8A, the substrate is certainly rinsed directly after etching the SiGe layer 11 with the fluorinated nitric acid solution, pulling the fluorinated nitric acid solution stayed in the hollow portion 25 out of the hollow portion 25 due to a surface tension of pure water. Hence, the fluorinated nitric acid solution stayed in the hollow portion 25 is easily removed. Here, as shown in FIG. 8B and indicated as the dotted arrow line, the method may be returned from step b4 to step b1 and step b1 to b4 may be repeated with arbitrary times. This repetition constrains accelerated etching of the Si layer 13 and extends etching time for the SiGe layer 11, forming the SOI layer having a large area with a high yield.

Second Embodiment

Figure 9A:
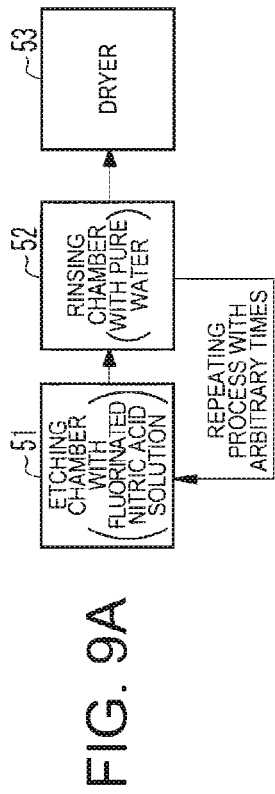
FIG. 9 shows orders of selective etching a SiGe layer 11 (a dipping method.)

FIGS. 9A and 9C show procedures of selective etching (dipping type) of the SiGe layer 11. Here, as examples of dipping type wet etching, three methods (A) to (C) will be explained. Namely, the wet etching device shown in FIG. 9A comprises an etching chamber 51, a rinsing chamber 52 and a dryer 53. The fluorinated nitric acid solution is stored in the etching chamber 51 and pure water is stored in the rinsing chamber 52. Further, the etching chamber 51 includes a circulating line not shown in the figure, which circulates the fluorinated nitric acid solution, and a filter in the circulating line for filtering impurities and foreign materials.

In FIG. 9A, the Si substrate 1 is dipped into the fluorinated nitric acid solution stored in the etching chamber 51 and the SiGe layer is wet-etched. Next, the Si substrate 1 is taken out of the etching chamber 51 after one minute later. Then, the Si substrate 1 is dipped into pure water stored in the rinsing chamber 52 and rinsed. Next, the Si substrate 1 is taken out of the rinsing chamber 52. Further, the Si substrate 1 is refilled into the fluorinated nitric acid solution stored in the etching chamber 51 and the SiGe layer is wet-etched again. Then, the Si substrate 1 is taken out from the etching chamber 51 after one minute later and refilled into pure water stored in the rinsing chamber 52 for rinsing the substrate. Such etching and rinsing are repeated several times. Then, the Si substrate 1 is moved from the rinsing chamber 52 to the dryer 53 and dried.

On the other hand, the wet etching device shown in FIG. 9A comprises etching chambers 61, 62 and 63, a rinsing chamber 64 and a dryer 65. The fluorinated nitric acid solution is stored in etching chambers 61, 62 and 63 and pure water is stored in the rinsing chamber 64. Further, the etching chambers 61 62 and 63 include a circulating line not shown in the figure, which circulates the fluorinated nitric acid solution, and a filter in the circulating line for filtering impurities and foreign materials.

Figure 9B:
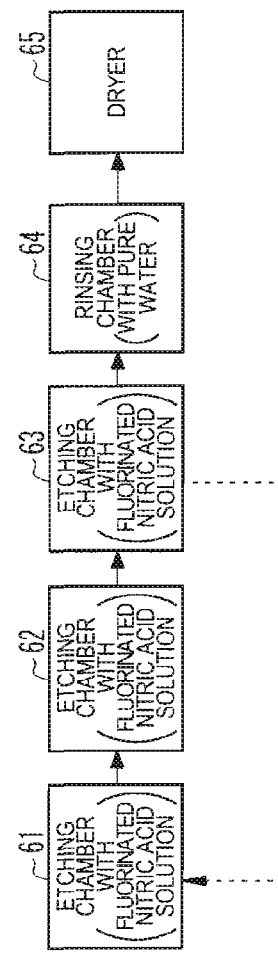
Figure 9B:
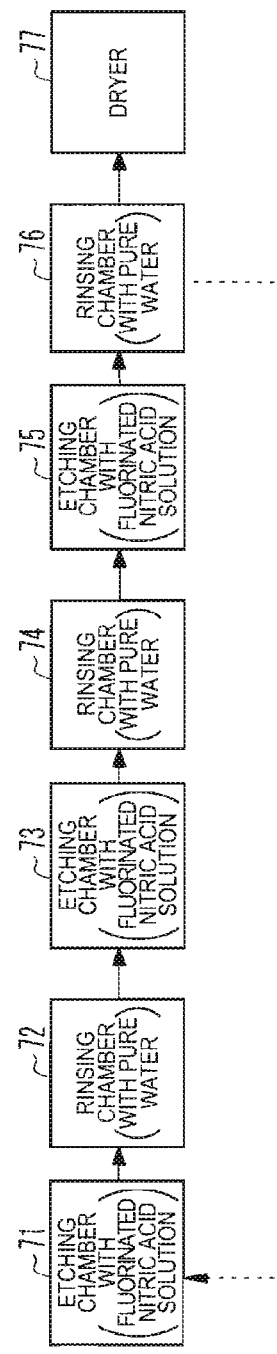

In FIG. 9B the Si substrate 1 is dipped into the fluorinated nitric acid solution stored in the etching chamber 61 and the SiGe layer is wet-etched. Next, the Si substrate 1 is taken out of the etching chamber 61 after one minute later. Further, the Si substrate 1 is refilled into the fluorinated nitric acid solution stored in the etching chamber 62 and the SiGe layer 11 is wet-etched again. Next, the Si substrate 1 is taken out of the etching chamber 62 after one minute later. Further, the Si substrate 1 is refilled into the fluorinated nitric acid solution stored in the etching chamber 63 and the SiGe layer 11 is wet-etched again. Next, the Si substrate 1 is taken out of the etching chamber 63 after one minute later. Then, the Si substrate 1 is dipped into pure water stored in the chamber 64 and the substrate is moved to and dried by the dryer 65 after rinsing.

On the other hand, the wet etching device shown in FIG. 9C comprises first, second and third etching chambers 71, 73 and 75, first, second and third rinsing chamber 72, 74 and 76 and a dryer 7. The fluorinated nitric acid solution is stored in etching chambers 71, 73 and 75 and pure water is stored in the rinsing chamber 72, 74 and 76. Further etching chambers 71, 73 and 75 include a circulating line not shown in the figure, which circulates the fluorinated nitric acid solution, and a filter in the circulating line for filtering impurities and foreign materials.

In FIG. 9C, the Si substrate 1 is dipped into the fluorinated nitric acid solution stored in the etching chamber 71 and the SiGe layer 11 is wet-etched. Then, the Si substrate 1 is taken out from the etching chamber 71 after one minute later and refilled into pure water stored in the rinsing chamber 72 for rinsing the substrate. Further, the Si substrate 1 is refilled into the fluorinated nitric acid solution stored in the etching chamber 73 and the SiGe layer 11 is wet-etched again. Then, the Si substrate 1 is taken out from the etching chamber 73 after one minute later and refilled into pure water stored in the rinsing chamber 74 for rinsing the substrate. Further, the same etching done in above chambers 71 and 73 is processed in the etching chamber 75 and the same rinsing done in above chambers 72 and 74 is processed in the rinsing chamber 76. After rinsing is completed in the chamber 76, the Si substrate 11 is moved to and dried by the dryer 77.

According to etching methods shown in FIG. 9A to 9C, the fluorinated nitric acid solution is supplied to the inside of the hollow portion 25 by dipping the Si substrate 1 ill the etching chamber and the fluorinated nitric acid solution is removed from the inside of the hollow portion 25 by taking the Si substrate 1 out of the etching chamber. Hence, a new liquid including the fluorinated nitric acid solution is supplied into the hollow portion that is under formation before increasing the concentration of the nitrous acid) always constraining a predetermined concentration of the nitrous acid and etched products within the hollow portion. Accordingly, this method avoids accelerated etching of the Si layer 13 facing the hollow portion 205.

Further, as etching methods shown in FIGS. 9A to 9C, the substrate is certainly rinsed directly after taking the Si substrate 1 out of the etching chamber, pulling the fluorinated nitric acid solution stayed in the hollow portion 25 out of the hollow portion 25D due to a surface tension of pure water, Hence, the fluorinated nitric acid solution stayed in the hollow portion 25 is easily removed. As shown in FIG. 9A and indicated as the dotted arrow line, the Si substrate 1 taken out of the etching chamber 63 may be returned to the etching chamber 61 and the etching of the SiGe later may be repeated. Further, as shown in FIG. 9C and indicated as the dotted arrow line, the Si substrate 1 taken out of the etching chamber 76 may be returned to the etching chamber 71 and the etching of the SiGe later may be repeated. This repetition constrains accelerated etching of the Si layer 13 and extends etching tune for the SiGe layer 11, forming the SOI layer having a large area with a high yield.

The fluorinated nitric acid solution used in the above first and second embodiments may preferably include $HNO_3$ and $H_2O$ of which volume ratio to HF is more than or equal to fifty times. Further, the fluorinated nitric acid solution may preferably include acetic acid. The inclusion of acetic acid constrains generating the nitrous acid, at the time of etching the SiGe layer 13 with the fluorinated nitric acid solution, attaining favorite etching ratio to Si.

The present invention is not; limited to the above-mentioned embodiments and can be applied to various modifications within a spirit of the invention.

What is claimed is:

1. A method of manufacturing a semiconductor device, comprising:
   a) forming a SiGe layer on a substrate;
   b) forming a Si layer on the SiGe layer;
   c) forming a groove that exposes a side surface of the SiGe layer by partly and sequentially etching a supporting member, the Si layer, and the SiGe layer; and
   d) forming a hollow portion between the substrate and the Si layer by etching the SiGe layer from the groove,
   step d) includes:
      forming a first part of the hollow portion by supplying a first etching liquid to the groove;
      removing a second etching liquid from the first part of the hollow portion, the first etching liquid changing to the second etching liquid after the first part being etched;
      forming a second part of the hollow portion by supplying a third etching liquid to the first part of the hollow portion; and
      removing a fourth etching liquid from the second part of the hollow portion, the third etching liquid changing to the fourth etching liquid after the second part being etched,
      wherein the first etching liquid and the third etching liquid including a fluorinated nitric acid solution that has not generated nitrous acid within itself due to etching the SiGe layer or includes an extremely low concentration of nitrous acid due to etching the SiGe layer, and
      wherein the fluorinated nitric acid solution includes $HNO_3$ and $H_2O$, where the $HNO_3$ and $H_2O$ volume ratio to HF is more than or equal to fifty times.

2. The method of manufacturing a semiconductor device according to claim 1, wherein
   the fluorinated nitric acid solution includes acetic acid.

3. The method of manufacturing a semiconductor device according to claim 1, further comprising:
   forming an oxide layer in the hollow portion; and
   forming an insulating layer on the substrate of which height is the same of upper surface of the Si layer so as to form a SOI structure.

4. The method of manufacturing a semiconductor device according to claim 1, wherein each of the first etching liquid and the third etching liquid is a solution that has not been previously used for etching the SiGe layer.

5. The method of manufacturing a semiconductor device according to claim 1, wherein the supporting member is disposed on a side of the Si layer opposite the substrate at least at the time the hollowed portion is formed.

6. A method of manufacturing a semiconductor device, comprising:
   a) forming a SiGe layer on a substrate;
   b) forming a Si layer on the SiGe layer;
   c) forming a groove that exposes a side surface of the SiGe layer by partly and sequentially etching a supporting member, the Si layer, and the SiGe layer; and
   d) forming a hollow portion between the substrate and the Si layer by etching the SiGe layer from the groove, wherein
   step d) includes etching the SiGe layer by repeating dipping the substrate into a plurality of etching process chambers in series, each etching process chamber containing a new liquid including a fluorinated nitric acid solution that has not generated nitrous acid within itself due to etching the SiGe layer or includes an extremely low concentration of nitrous acid due to etching the SiGe layer.

7. The method of manufacturing a semiconductor device according to claim 6, wherein
   step d) includes alternately repeating dipping the substrate into a new liquid including a fluorinated nitric acid solution that has not generated nitrous acid within itself due to etching the SiGe layer or includes an extremely low concentration of nitrous acid due to etching the SiGe layer stored in a plurality of etching process chambers for etching and dipping the substrate into pure water stored in a rinsing process chamber for rinsing.

8. The method of manufacturing a semiconductor device according to claim 6,
   step d) further comprises dipping the substrate into a plurality of rinsing process chambers in series, each rinsing process chamber containing pure water.

9. The method of manufacturing a semiconductor device according to claim 6, wherein the supporting member is disposed on a side of the Si layer opposite the substrate at least at the time the hollowed portion is formed.

* * * * *